United States Patent
Tennant

(10) Patent No.: US 7,608,906 B2
(45) Date of Patent: Oct. 27, 2009

(54) SIMULTANEOUS UNIPOLAR MULTISPECTRAL INTEGRATED TECHNOLOGY (SUMIT) DETECTORS

(75) Inventor: William Tennant, Thousand Oaks, CA (US)

(73) Assignee: Teledyne Licensing, LLC, Thousand Oaks, CA (US)

( * ) Notice: Subject to any disclaimer, the term of this patent is extended or adjusted under 35 U.S.C. 154(b) by 0 days.

(21) Appl. No.: 11/939,527

(22) Filed: Nov. 13, 2007

(65) Prior Publication Data

US 2009/0121307 A1    May 14, 2009

(51) Int. Cl.
*H01L 31/103* (2006.01)

(52) U.S. Cl. .................. 257/461; 257/186; 257/431; 257/465; 257/466; 257/E27.133; 257/E27.134; 257/E27.135

(58) Field of Classification Search .............. 257/431, 257/447, 448, 461, 186, 465, 466, E27.133, 257/E27.134, E27.135
See application file for complete search history.

(56) References Cited

U.S. PATENT DOCUMENTS

| | | | |
|---|---|---|---|
| 6,476,374 B1 * | 11/2002 | Kozlowski et al. | 250/214.1 |
| 6,727,521 B2 * | 4/2004 | Merrill | 257/98 |
| 6,803,557 B1 | 10/2004 | Taylor et al. | |
| 6,930,336 B1 * | 8/2005 | Merrill | 257/292 |
| 7,419,844 B2 * | 9/2008 | Lee et al. | 438/48 |
| 2003/0209652 A1 * | 11/2003 | Fujii et al. | 250/214.1 |
| 2003/0218120 A1 * | 11/2003 | Shibayama | 250/214.1 |

* cited by examiner

*Primary Examiner*—Davienne Monbleau
*Assistant Examiner*—Eduardo A Rodela

(57) ABSTRACT

A multi-color photo sensor having a first photodiode with a first p-type layer and a first n-type layer, the first photodiode generates charge when illuminated with photons of a first wavelength range, a second photodiode with a second p-type layer and a second n-type layer, the second photodiode generates charge when illuminated with photons of a second wavelength range, and a readout integrated circuit electrically coupled to the first n-type layer of the first photodiode via a first metal interconnect and electrically coupled to the second n-type layer of the second photodiode via a second metal interconnect, the second metal interconnect traverses through the first photodiode to contact the second n-type layer of the second photodiode, the second metal interconnect is separated from the first photodiode by a first passivating insulator.

15 Claims, 7 Drawing Sheets

US 7,608,906 B2

SIMULTANEOUS UNIPOLAR MULTISPECTRAL INTEGRATED TECHNOLOGY (SUMIT) DETECTORS

BACKGROUND

This disclosure relates to photodetectors. More particularly, the invention relates to simultaneous unipolar multispectral integrated technology (SUMIT) detectors.

SUMMARY

A multi-color photo sensor having a first photodiode with a first p-type layer and a first n-type layer, the first photodiode generates charge when illuminated with photons of a first wavelength range, a second photodiode with a second p-type layer and a second n-type layer, the second photodiode generates charge when illuminated with photons of a second wavelength range, and a readout integrated circuit electrically coupled to the first n-type layer of the first photodiode via a first metal interconnect and electrically coupled to the second n-type layer of the second photodiode via a second metal interconnect, the second metal interconnect traverses through the first photodiode to contact the second n-type layer of the second photodiode, the second metal interconnect is separated from the first photodiode by a first passivating insulator.

According to another feature of the present disclosure, a multi-color photo sensor with a barrier layer is disclosed. The multi-color photo detector having a first photodiode with a first p-type layer and a first n-type layer, the first photodiode generates charge when illuminated with light photons of a first wavelength range, a second photodiode with a second p-type layer and a second n-type layer, the second photodiode generates charge when illuminated with light photons of a second wavelength range, a barrier layer separating the first photodiode from the second photodiode to prevent spectral cross-talk, and a readout integrated circuit electrically coupled to the first p-type layer of the first photodiode via a first metal interconnect and electrically coupled to the second p-type layer of the second photodiode via a second metal interconnect, the second metal interconnect traverses through the first photodiode and the barrier layer to contact the second p-type layer of the second photodiode, the second metal interconnect is separated from the first photodiode and the barrier layer by a first passivating insulator.

According to a feature of the present disclosure, the second metal interconnect traverses through the second n-type layer and the second p-type layer of the second photodiode, the first passivating insulator separates the second metal interconnect from the second n-type layer and the second p-type layer of the second photodiode, the second metal interconnect extends beyond the second p-type layer and contacts an exposed surface of the second p-type layer. In one embodiment, the multi-color photo detector includes a third metal interconnect that electrically couples the second metal interconnect to the second p-layer. The multi-color photo detector may also include a third photodiode having a third n-type layer, the third photodiode generates charge when illuminated with light photons of a third wavelength range, a graded composition barrier separating the second n-type layer of the second photodiode from the third n-type layer of the third photodiode, and a voltage bias applied to the third photodiode to control the flow of charge generated from the second and third photodiodes.

According to a feature of the present disclosure, a multi-color photo sensor having a readout integrated circuit, a first region, a second region and a third region, is disclosed. The first region having a first composition and electrically coupled to the readout integrated circuit via a first metal interconnect. The second region having a graded second composition and separating the first region from the third region. The third region having a third composition and electrically coupled to the readout circuit via a second metal interconnect that traverses through the first region and the second region, the second metal interconnect is separated from the first region and the second region by a first passivating insulator. In one embodiment, the second metal interconnect traverses through the third region, the first passivating insulator separates the second metal interconnect from the third region, the second metal interconnect extends beyond the third region and contacts an exposed surface of the third region.

DRAWINGS

The above-mentioned features and objects of the present disclosure will become more apparent with reference to the following description taken in conjunction with the accompanying drawings wherein like reference numerals denote like elements and in which.

DETAILED DESCRIPTION

Photodiodes are widely used in digital imaging devices to convert optical signals into electrical signals. Photodiodes may be arranged in linear or planner arrays with a plurality of photosensitive sensors, generally designated as pixels, on a semiconductor chip. Each pixel generates an output signal representing the amount of light incident on the pixel.

According to one embodiment of the present invention, photodiodes may be used in a multi-color photo detector architecture. For example, photodiodes may be used with two-color photo detector architectures having High Fill Factor (HF), Spectral Tunability (ST) and/or Additional Bands (AB). The two-color photo detector architecture may have a photodiode for long-wave band displaced or separated from photodiode for mid-wave band. This allows the two-color photo detector to display colors, providing more information on the same image.

Figure 1:
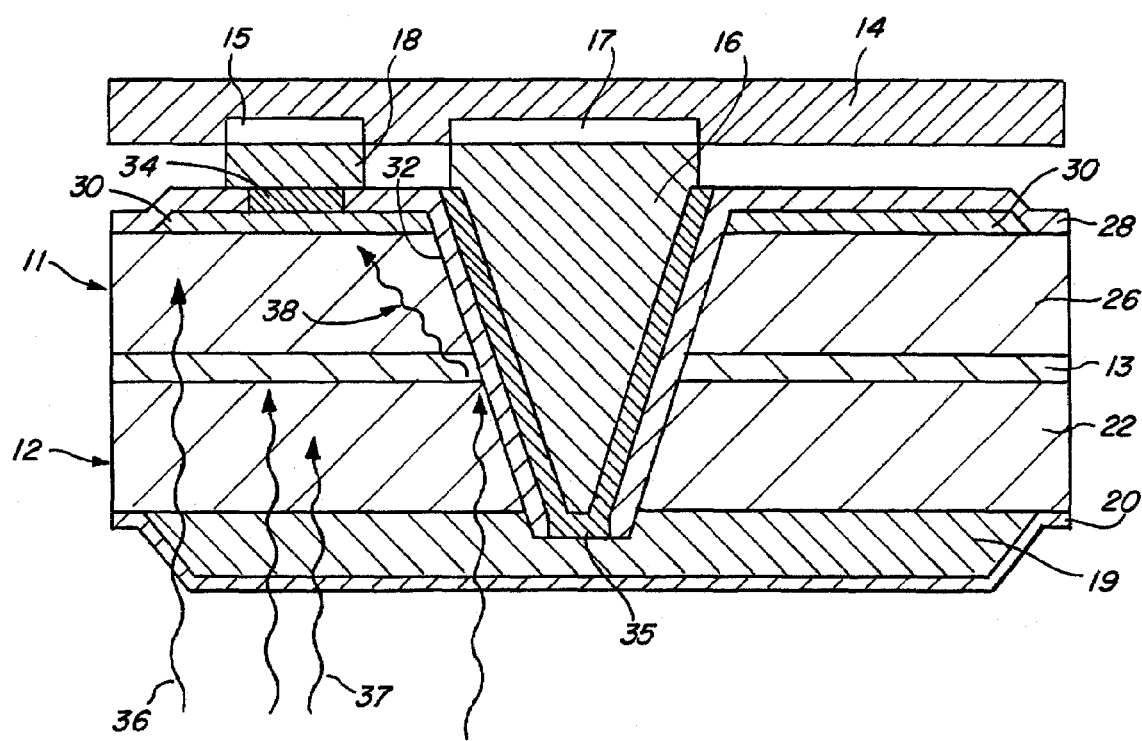
FIG. 1 is a two-color pixel architecture with high fill factor, according to one embodiment of the present invention.

FIG. 1 is a two-color pixel architecture 10 with high fill factor, according to one embodiment of the present invention. The two-color pixel 10 has a high fill factor in both spectral bands. Both spectral bands are collecting light from the same side but with low cross-talk in the spectral band. The two-color pixel 10 may include a first photodiode 11, a second photodiode 12, a barrier layer 13, a readout circuit 14, a first input circuit 15 and a second input circuit 17.

The first photodiode 11 may include a first p-type region 30 and a first n-type layer 26. The first photodiode 11 generates charge when illuminated with light photons of a first wavelength range. For example, the first photodiode 11 collects photons whose Band 2 range is from about 5 microns to about 10 microns, collecting long wave infrared light. The first p-type region 30 may be a Band 2 shorter-wave p-region while the first n-type layer 26 may be a Band 2 long-wave n-common. In one embodiment, the first p-type region 30 is the reticulated region of the first photodiode 11. The first p type region 30 may be reticulated along its edges or be implanted or diffused into an n-type layer. The n-common region may absorb the Band 2 light and turn it into electrical charges that are collected by the first p-type region 30.

The second photodiode 12 may include a second p-type region 19 and a second n-type layer 22. The second photodiode 12 generates charge when illuminated with light photons of a second wavelength range. For example, the second photodiode 12 collects photons whose Band 1 nominal range is from about 3 microns to about 5 microns, collecting midwave infrared (MWIR) light. The second p-type region 19 may have a Band 1 MWIR or shorter cutoff while the second n-type layer 22 may be an n-common Band 1 absorber. In one embodiment, the second p-type region 19 is the reticulated region of the second photodiode 12. The second p-type region 19 may be reticulated along its edges. The n-common region may absorb the Band 1 light and turn it into electrical charges that are collected by the second p-type region 19.

P-type layers 19 and 30 may be configured to transfer holes to the readout circuit 14. For example, the first p-type region 30 may transfer holes through a first metal contact 34 and a first metal interconnect 18, while the second p-type region 19 may transfer holes through a second metal contact 35 and a second metal interconnect 16. In one embodiment, p-type layers 19 and 30 may be etched on the sides for isolation. Interconnects 16 and 18 may be an indium connection, a solder bump or any other metal interconnect. The metal contacts 34 and 35 may be used to improve the metallurgical interaction between the interconnects 18 and 16 with the p-type layers 30 and 19, respectively. Each metal contact 34 or 35 may act like a barrier to prevent the metal interconnects 18 and 16 from harming the p-type layers 30 and 19. According to an embodiment, the second metal interconnect 16 may have a generally cone or hemispherical shape. As shown in FIG. 1, the second metal interconnect 16 may be placed in a via 32 traversing through the first p-type region 30, the first n-type layer 26, the barrier layer 13 and the second n-type layer 22. A first passivating insulator 28 separates the second metal interconnect 16 from the first p-type region 30, the first n-type layer 26, the barrier layer 13 and the second n-type layer 22. Alternatively, the second metal interconnect 16 may contact the metal contact 35 on the surface of the first passivating insulator 28.

In one embodiment, barrier layer 13 may be used to separate the first photodiode 11 from the second photodiode 12 to prevent spectral cross-talk. The barrier layer 13 may be made from a wider band gap material than either first wavelength range (Band 2) or second wavelength range (Band 1). By using a wider band gap material, the barrier layer 13 prevents carriers, generated by the light absorbed in each n-type layer 22 and 26, from flowing into the wrong photodiode 11 and 12. Hence, Band 2 carriers are kept in the vicinity of Band 2 photodiode 11, rather than travel to photodiode 12, and vice versa.

Barrier layer 13 may have a wider band gap composition of the same material that photodiodes 11 and 12 are made of. In one embodiment, the first photodiode 11, the second photodiode 12 and the barrier layer 13 are all made from different compositions of $Hg_{1-x}Cd_xTe$. For example, the first p-type region 30 may have a composition of $Hg_{0.74}Cd_{0.26}Te$, the first n-type layer 26 may have a composition of $Hg_{0.8}Cd_{0.2}Te$, the barrier layer 13 may have a composition of $Hg_{0.6}Cd_{0.4}Te$, the second n-type layer 22 may have a composition of $Hg_{0.75}Cd_{0.25}Te$ to $Hg_{0.72}Cd_{0.28}Te$, and the second p-type region 19 may have a composition of $Hg_{0.7}Cd_{0.3}Te$ to $Hg_{0.6}Cd_{0.4}Te$. By changing the composition of the same material, the band gap can be altered to suit the spectral region or create barrier layer 13. Other materials, such as zinc or selenium, may also be added in small quantities to allow the band gap to vary independently of the lattice parameter.

As shown in FIG. 1, the readout circuit 14 may be electrically coupled to the first p-type region 30 of the first photodiode 11 via the first metal interconnect 18 and electrically coupled to the second p-type region 19 of the second photodiode 12 via the second metal interconnect 16. The second metal interconnect 16 may traverse through the first photodiode 11 and the barrier layer 13 to contact the second p-type region 19 of the second photodiode 12. The readout circuit 14 may be mechanically coupled to the first passivating insulator 28 using an epoxy (not shown) to provide mechanical integrity while removing the handling substrate (not shown). The air gap between the readout circuit 14 and the first passivating insulator 28 may be backfilled with the epoxy (not shown).

The first input circuit 15 is the input circuit for the first photodiode 11, while the second input circuit 17 is the input circuit for the second photodiode 12. Input circuits 15 and 17 may comprise a capacitive trans-impedance amplifier, direct injection circuit, source follower circuit, or other circuits as is well known to a person skilled in the art.

In one embodiment, the second metal interconnect 16 may be separated from the first photodiode 11 and the barrier layer 13 by first passivating insulator 28. The first passivating insulator 28 may also separate the second metal interconnect 16 from the second n-type layer 22 of the second photodiode. The first passivating insulator 28 may cover the exposed surface of the first p-type region 30 to protect it from being shorted out by various contact materials that are in the surrounding environment. A second passivating insulator 20 may also be used to cover the exposed surface of the second p-type region 19. As can be envisioned by a person skilled in the art, the passivating insulators 20 and 28 may comprise a plurality of layer structures, the first layer being in contact with the respective p-type layers 19 and 30. The passivating insulators 20 and 28 may be made from CdTe with a different band gap composition from photodiodes 11 and 12.

In operation, light of different wavelengths passes through the two-color pixel architecture 10. Light 36 with wavelength shorter than the first wavelength range terminates in Band 1 n-type layer 22, while light 36 with wavelength longer than the second wavelength range terminates in Band 2 n-type layer 26. In one embodiment, light 36 with wavelength longer than the second wavelength range passes through the second passivating insulator 20, the second p-type region 19, the second n-type layer 22, the barrier layer 13, and gets absorbed in the first n-type layer 26. Since layer 26 is n-type, it creates electron hole pairs (not shown). The holes diffuse until they are captured by the first p-type region 30. The holes are transferred to the readout circuit 14, creating a photocurrent that flows through the first metal contact 34 and the first interconnect 18. In another embodiment, light 36 with wavelength shorter than the first wavelength range passes through the second passivating insulator 20, the second p-type region 19 where it may be absorbed if light 36 has short wavelength, or may be absorbed in the second n-type layer 22. If light 36 is absorbed in the second p-type region 19, electrons are generated and diffuse to the junction with the second metal contact 35, creating a photocurrent that flows through the second metal contact 35, the second interconnect 16 and into the readout circuit 14. If light 36 is absorbed in the second n-type layer 22, holes are diffused back to the second p-type region 19, where they are captured and collected through second metal contact 35 and second interconnect 16, and carried off by the readout circuit 14.

Due to the configuration of the two-color pixel architecture 10, light 36 may reflect against surface 32 of the first passivating insulator 28 and against the second metal contact 35. In one embodiment, reflected light 38 is totally reflected by the second metal contact 35, but bounces off of the surface 32 and reflects into the first n-type layer 26. Light 38 reflected in the first n-type layer 26 is then absorbed, creating electron hole pairs (not shown). The holes diffuse until they are captured by the first p-type region 30, which are then transferred to the readout circuit 14. Hence, except for some light 36 that might hit the second metal contact 35, most of the light is absorbed by the two-color pixel architecture 10.

The two-color pixel architecture 10 may be fabricated by a multi-step fabrication process, such as deposition techniques well known in the art. In one embodiment, Molecular Beam Epitaxy (MBE) may be used to grow a depleted heterostructure having a p-layer with band gap wider than the first desired spectral band, a graded n-layer to the first active band, and a first band active layer. Alternatively the grown junction may be a conventional heterostructure. MBE may also be used for the wider band gap barrier layer 13, a second band active layer and a cap layer (which also may have the depleted heterostructure architecture or may be conventional for use with implantation). After epitaxial growth, a contact via 32 may be etched through all layers, using for example a dry etch process and/or a wet chemical etch. The two-color pixel 10 may then be passivated 28 and annealed to activate the implant and further remove damage. Contacts 34 and 35 may then be defined and metal and indium columns are placed on the Band 2 contact via 32 and in the Band 1 deep contact hole. The two-color pixel 10 may be hybridized and the substrate, such as a sapphire substrate, is removed. Furthermore, the back surface may be etched to delineate pixels. The back surface may also be passivated 20 and coated with an anti-reflective (AR) coating. The backside may be processed to isolate the two-color pixel 10. Micro-lens enhancement may also be used with separate deposition. For example, an optical layer (not shown) may be deposited over the second passivating insulator 20 with micro-lens to capture the light 36 and focus it on the two-color pixel 10. Other techniques, such as Metal Organic Chemical Vapor Deposition (MOCVD) may be used in addition to or instead of MBE.

Figure 2:
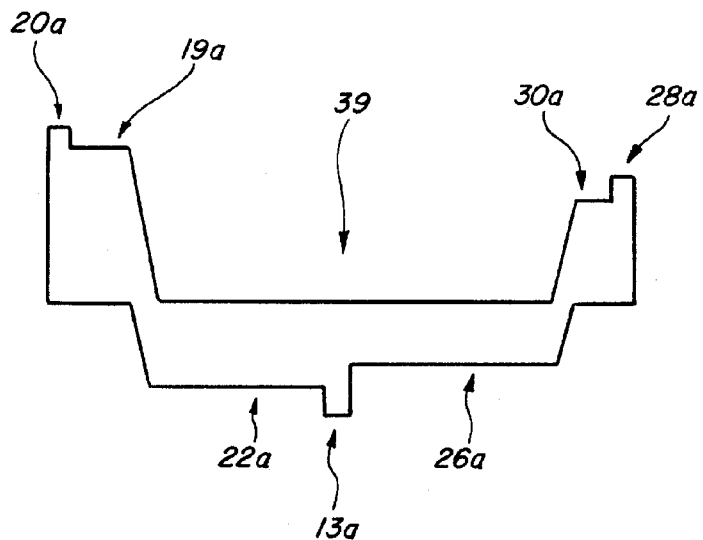
FIG. 2 illustrates the band gap profile for the two-color pixel architecture of FIG. 1.

FIG. 2 illustrates the band gap profile 39 for the two-color pixel architecture 10 of FIG. 1. The band gap profile 39 illustrates the conduction and valence band energy levels as a function of position, whereby the band gap is defined as the energy difference between the conduction and valence bands. The band gap profile 39 may include a second passivating insulator energy levels 20a, a second p-type layer energy levels 19a, a second n type layer energy levels 22a, a barrier layer energy levels 13a, a first n type layer energy levels 26a, a first p-type layer energy levels 30a, and a first passivating insulator energy levels 28a. The second passivating insulator energy levels 20a is the conduction and valence band energy levels for the second passivating insulator 20, while the second p-type layer energy levels 19a is the conduction and valence band energy levels for the second p-type region 19. Similarly, the second n-type layer energy levels 22a is the conduction and valence band energy levels for the second n-type layer 22, the barrier layer energy levels 13a is the conduction and valence band energy levels for the barrier layer 13, the first n type layer energy levels 26a is the conduction and valence band energy levels for the first n-type layer 26, the first p-type layer energy levels 30a is the conduction and valence band energy levels for the first p-type region 30, and the first passivating insulator energy levels 28a is the conduction and valence band energy levels for the first passivating insulator 28. Grading the energy gap from one layer to the next may be used to facilitate charge transport to reduce defects to minimize interface recombination or for other beneficial reasons known to persons skilled in the art.

Figure 3:
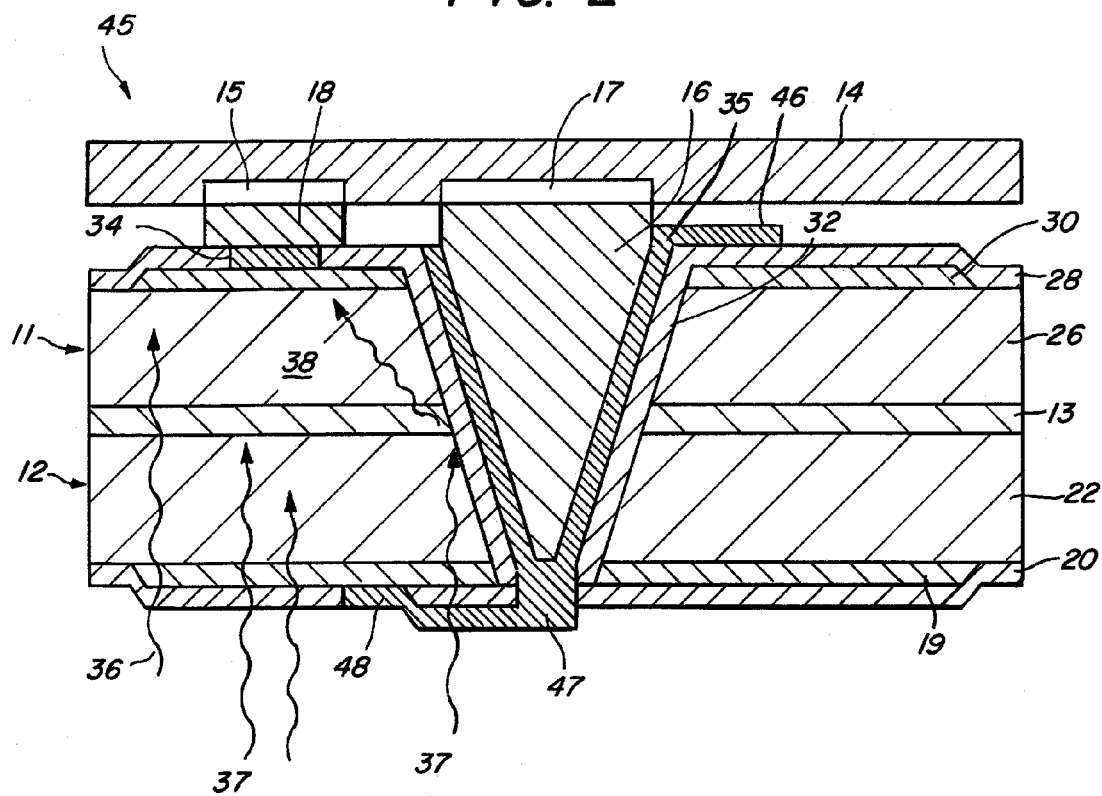
FIG. 3 is a two-color pixel architecture with high fill factor, according to an embodiment of the present invention.

FIG. 3 is a two-color pixel architecture 45 with high fill factor, according to an embodiment of the present invention. The two-color pixel architecture 45 may include a second metal interconnect 16 placed in a via 32 traversing through the first p-type region 30, the first n-type layer 26, the barrier layer 13, the second n-type layer 22, the second p-type region 19 and the second passivating insulator 20. The first passivating insulator 28 separates the second metal interconnect 16 from the first p-type region 30, the first n-type layer 26, the barrier layer 13, the second n-type layer 22, and the second p-type region 19. In one embodiment, the second metal interconnect 16 includes an interconnect metallization 47 that extends beyond the second p-type region 19 and contacts an exposed surface 48 of the second p-type region 19. The interconnect metallization 47 may be made of a single or multi-layer molybdenum nitride (MoN), gold (Au), titanium (Ti), nickel (Ni), or any other metal known to a person skilled in the art. As can be envisioned by a person skilled in the art, this embodiment may provide for easier fabrication that opens a contact hole at the end of the first passivating insulator 28 by coating the via 32 with the first passivating insulator 28, etching from the backside to make contact with the bottom of the via 32, then extending the interconnect metallization 47 to contact the backside surface 48 of the second p-type region 19.

Figure 4:
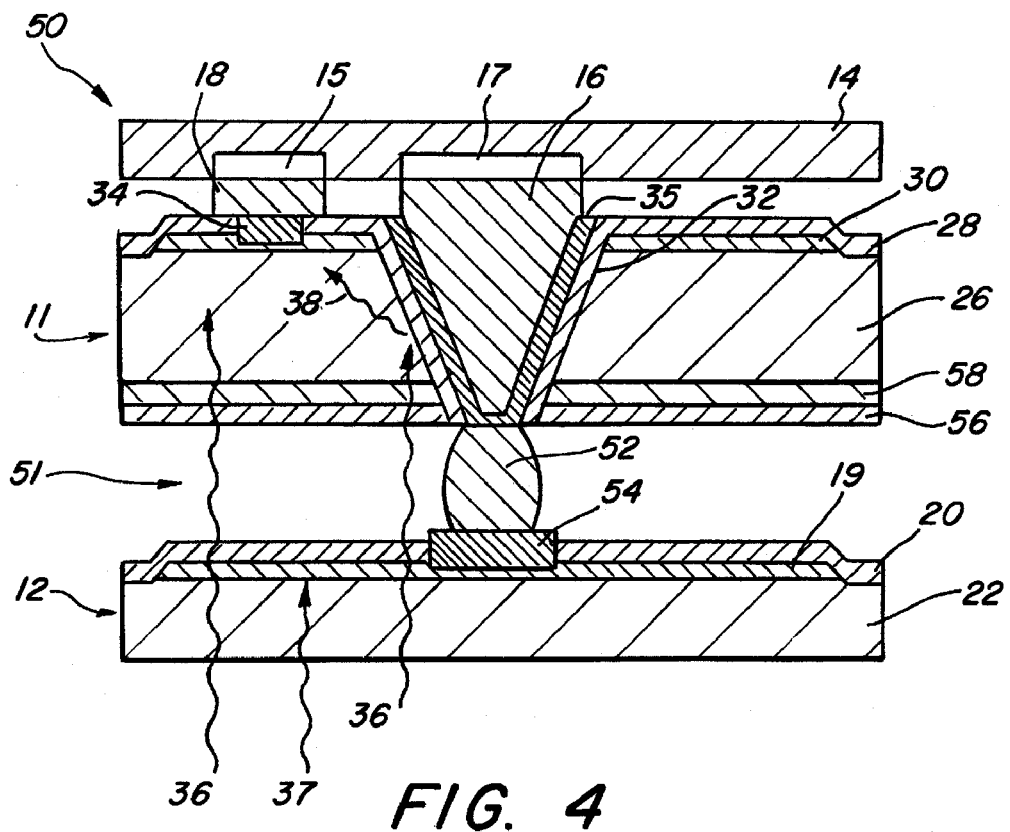
FIG. 4 is a hybrid two-color pixel architecture with high fill factor, according to an embodiment of the present invention.

FIG. 4 is a hybrid two-color pixel architecture 50 with high fill factor, according to an embodiment of the present invention. The hybrid two-color pixel architecture 50 may include first photodiode 11, second photodiode 12 and readout circuit 14. The first photodiode 11 is separated from the second photodiode 12 by a gap 51, which may be unfilled or filled with epoxy or other appropriate filler. The first photodiode 11 is coupled to the readout circuit 14 via first metal contact 34 and first metal interconnect 18. The second photodiode 12 is coupled to the readout circuit 14 via second metal contact 35 and second metal interconnect 16. The second metal interconnect 16 may be placed in via 32 traversing through the first photodiode 11 to contact a third metal interconnect 52, such as an indium bump, that is hybridized to a third metal contact 54 on the second photodiode 12. The second passivating layer 20 of the second photodiode 12 is etched to expose the second p-type layer 22 and allow deposition of the third metal contact 54 for hybridization of the first photodiode 11 to the second photodiode 12. The third metal interconnect 52 electrically couples the second metal interconnect 16 to the second p-region 19.

The first photodiode 11 may have a third passivating insulator 56 to cover the exposed back surface of the first n-type layer 26. In one embodiment, a wide band gap layer 58 may be deposited on the back surface of the first n-type layer 26, prior to passivating 56 the back side of the first photodiode 11. The wide band gap layer 58 may aid in the passivation of the first photodiode 11 by reducing the propensity of an imperfectly passivated surface to generate dark currents and to recombine photocurrent. Fabrication of the hybrid two-color pixel architecture 50 may include etching via 32 through all layers of the first photodiode 11 and passivating 56 the back side of the first n-type layer 26. Passivation may be applied prior to or after hybridization of the first photodiode 11 to the second photodiode 12.

As can be envisioned by a person skilled in the art, the thickness of every layer may vary as desired. The thickness of the first passivating insulator 28 may be about 2000 Å to about 8000 Å of CdTe. The first passivating insulator 28 may also be a multi-layer structure as is well known to a person skilled in the art. In one embodiment, the first passivating insulator 28 may be a composite with a thickness of about 500 Å to about 5000 Å of CdTe or CdZnTe, overcoated with about 500 Å to about 2000 Å of ZnS, $Si_3N_4$, or a combination thereof. The thickness of the first p-type region 30 may be about 1000 Å to about 3 microns, while the thickness of the first n-type layer 26 may be about 1 micron to about 12 microns. The barrier layer 13 may have a thickness of about 0.5 micron to about 4 microns.

The third passivating insulator 56 may have the same thickness and composition as the first passivating insulator 28. The third passivating insulator 56 may be anodic with a thickness of about 50 Å to about 200 Å. The third passivating insulator 56 may be coated with an anti-reflective (AR) coating, such as aluminum oxide, zinc sulfide, and germanium. The second passivating insulator 20 may have the same thickness and composition as the third passivating insulator 56. The second passivating insulator 20 may be anodized and coated with an anti-reflective (AR) coating. In one embodiment, the second passivating insulator 20 of the hybrid two-color pixel architecture 50 may have a composition and thickness tailored to allow high transmissions of longer wavelength to be absorbed in the first n-type layer 26. The second n-type layer 22 may have the same thickness as the first n-type layer 26. The second p-type region 19 may have a thickness of about 1000 Å to about 3 microns.

Figure 5:
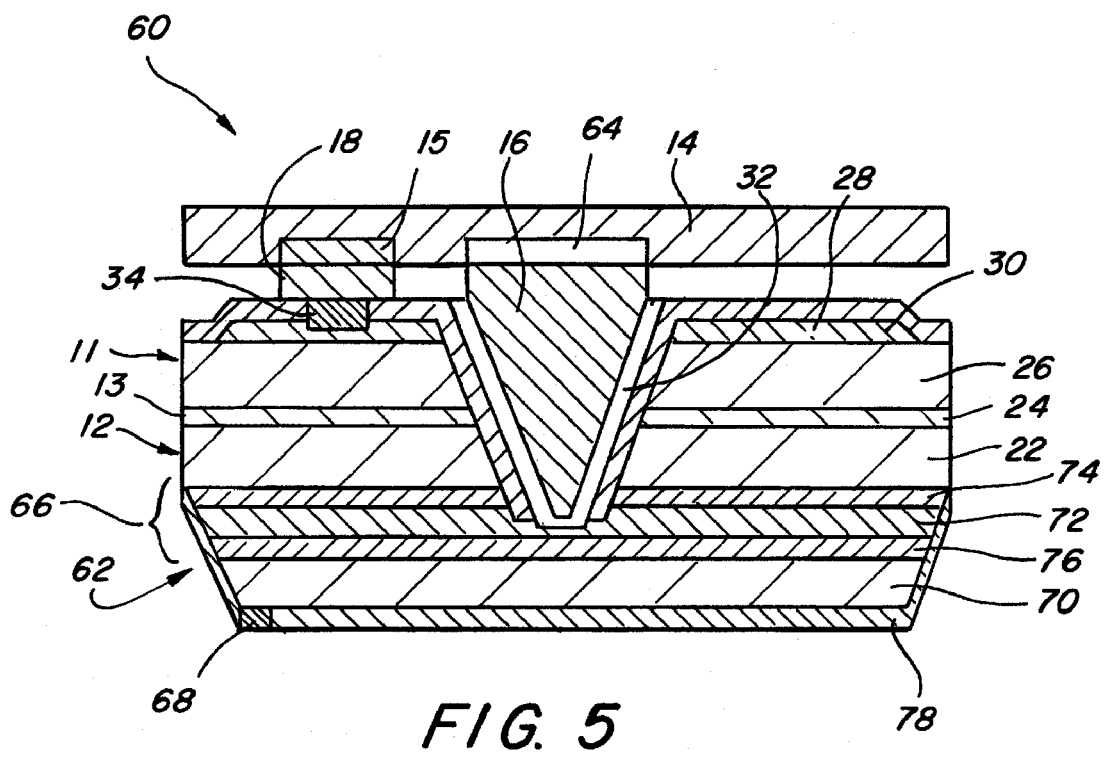
FIG. 5 is a multi-color pixel architecture with high fill factor, according to an embodiment of the present invention.

FIG. 5 is a multi-color pixel architecture 60 with high fill factor, according to an embodiment of the present invention. The multi-color pixel 60 may include first photodiode 11, second photodiode 12, a third photodiode 62, barrier layer 13, readout circuit 14, first input circuit 15, a combined input circuit 64, a graded composition region 66, a Band 3 common contact 68.

The combined input circuit 64 is the input circuit for the second photodiode 12 and the third photodiode 62. The combined input circuit 64 may be configured to handle two different polarities of current, depending on the double-biasing condition of the second metal interconnect 16. The second photodiode 12 may be reverse-biased while the third photodiode 62 may be forward-biased, to allow for collection of holes from the second photodiode 12, or vice versa, the third photodiode 62 may be reverse-biased while the second photodiode 12 may be forward-biased, to allow for collection of holes from the third photodiode 62.

The third photodiode 62 generates charge when illuminated with light photons of a third wavelength range. The third photodiode 62 may include a third n-type layer 70 that absorbs Band 3 light and turns it into electrical charges, which is then collected at the graded composition region 66. Band 3 may be the lowest band with the shortest cutoff wavelength. In one embodiment, Band 3 may be visible through infrared, with wavelength of less then or equal to about 2 microns, Band 1 would be from wherever Band 3 leaves off to a mid-wave region with wavelength of about 5 microns, and Band 2 would be from wherever Band 1 leaves off to a long-wave region of about 12 microns. As can be envisioned by a person skilled in the art, the selected wavelength range for Band 1, Band 2 and Band 3 depends upon the intended application of the multi-color pixel architecture 60.

The graded composition region 66 separates the second n-type layer 22 of the second photodiode 12 from the third n-type layer 70 of the third photodiode 62. In one embodiment, the graded composition region 66 may include a combined p-type layer 72, a first graded composition barrier 74 and a second graded composition barrier 76. The combined p-type layer 72 may be a graded wide band gap region located between the first graded composition barrier 74 and the second graded composition barrier 76. The first graded composition barrier 74 may have a wider band gap region than Band 1 of the second photodiode 12, but less than the band gap for the combined p-type layer 72. In one embodiment, the first graded composition barrier 74 has a graded composition that changes from the composition of the second n-type layer 22 to the composition of the combined p-type layer 72. The second graded composition barrier 76 may have a wider band gap region than the combined p-type layer 72, but less than the band gap for the third n-type layer 70 of the third photodiode 62. In one embodiment, the second graded composition barrier 76 has a graded composition that changes from the composition of the combined p-type layer 72 to the composition of the third n-type layer 70.

The first graded composition barrier 74, the combined p-type layer 72, the second graded composition barrier 76, and the third n-type layer 70 may be etched on the sides for isolation, as shown in FIG. 5. A passivating insulator 78 may be deposited to cover the exposed surfaces and protect the surfaces from being shorted out by various contact materials that are in the surrounding environment. To control the flow of charge generated from the second 12 photodiode and the third photodiode 62, a voltage bias is applied to the third photodiode 62. The voltage bias may be applied to the third photodiode 62 via the Band 3 common contact 68.

In one embodiment, to bias the second n-type layer 22 of Band 1 in a forward-biasing configuration, a positive voltage is applied to the Band 3 common contact 68. This prevents the minority carriers, generated by light in the Band 2 first n-type layer 26, from entering the Band 1 second n-type layer 22. Meanwhile, the minority carriers generated in Band 1 second n-type layer 22 can travel across the first graded composition barrier 74 and recombine at the p-n junction with the combined p-type layer 72. Because of the high reverse bias on Band 3 compared to the combined p-type layer 72, the minority carriers in Band 3 third n-type layer 70 diffuse across to the combined p-type layer 72, where they are captured and collected through the second metal interconnect 16. Conversely, to bias the second n-type layer 22 of Band 1 in a reverse-biasing configuration, a negative voltage is applied to the Band 3 common contact 68. The Band 1 second n-type layer 22 becomes reverse-biased, while the Band 3 third n-type layer 70 becomes forward-biased. This causes the Band 3 minority carriers to recombine, while the Band 2 minority carriers diffuse across to the combined p-type layer 72, where they are captured and collected through the second metal interconnect 16.

The first graded composition barrier 74 and the second graded composition barrier 76 may each have a thickness ranging from about 0.5 microns to about 3 microns. The thickness of the combined p-type layer 72 may be about 1 microns to about 4 microns. The third n-type layer 70 may have a thickness ranging from about 1 micron to about 10 microns. The passivating insulator 78 may be anodized with a thickness of about 50 Å to about 200 Å of CdTe.

Figure 6:
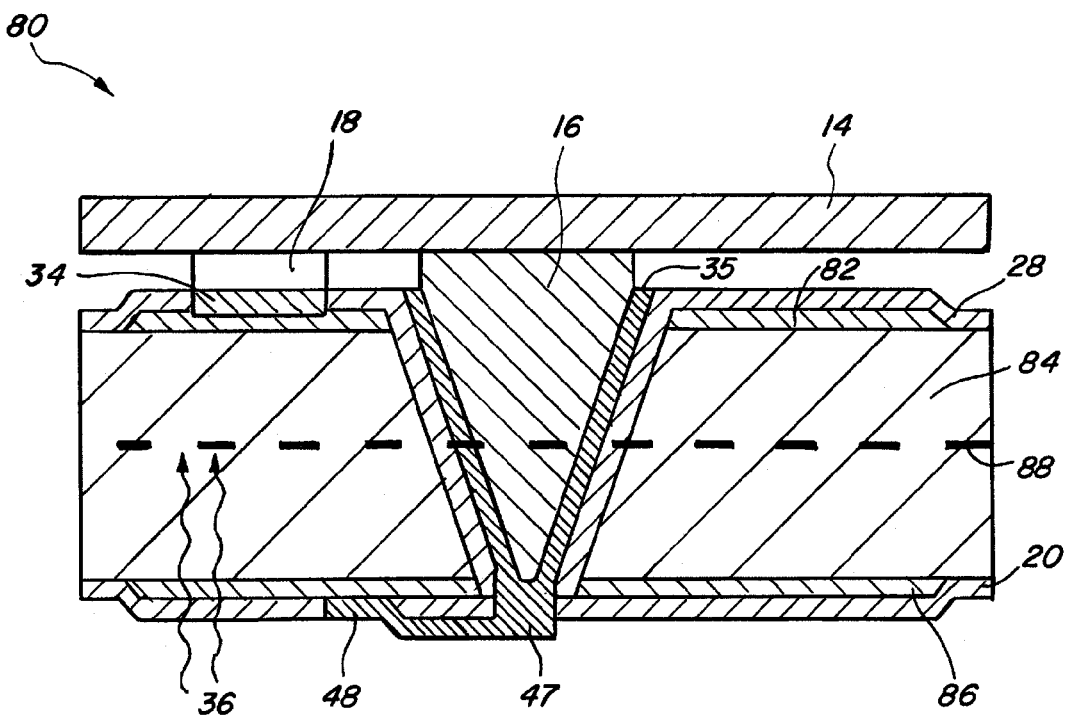
FIG. 6 is a multi-color pixel architecture with Spectral Tunability, according to an embodiment of the present invention.

FIG. 6 is a multi-color pixel architecture 80 with Spectral Tunability (ST), according to an embodiment of the present invention. The multi-color pixel architecture 80 may include readout circuit 14, a first region 82, a second region 84 and a third region 86. The first region 82 may have a first composition and electrically coupled to the readout circuit 14 via the first metal interconnect 34. The first region 82 may have similar composition and thickness as the first p-type region 30. The second region 84 may have a graded second composition and separating the first region 82 from the third region 86. In one embodiment, the second region 84 may be a graded composition n-type layer with doping of about $1 \times 10^{14}$ and thickness of about 6 microns. For example, the second region 84 may be a partially depleted n-region. The third region 86 may have a third composition and electrically coupled to the readout circuit 14 via a second metal interconnect 16 that traverses through the first region 82, the second region 84, the third region 86 and the second passivating insulator 20. The second metal interconnect 16 may be separated from the first region 82, the second region 84 and the third region 86 by the first passivating insulator 28. In one embodiment, the second metal interconnect 16 includes interconnect metallization 47 that extends beyond the third region 86 to contact the backside surface 48 of the third region 86.

Figure 7:
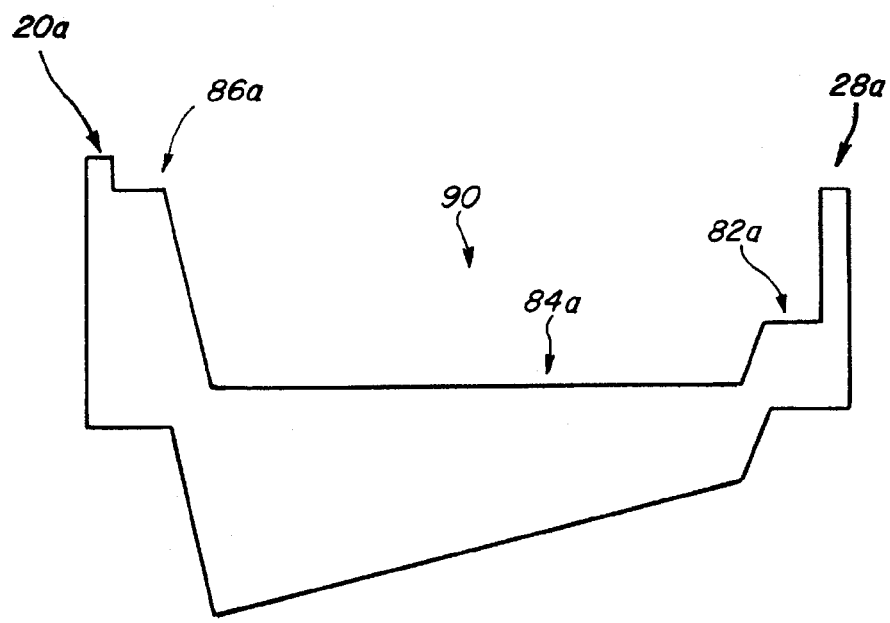
FIG. 7 illustrates the band gap profile across the multi-color pixel architecture of FIG. 6, without any bias applied to the backside surface.
Figure 8:
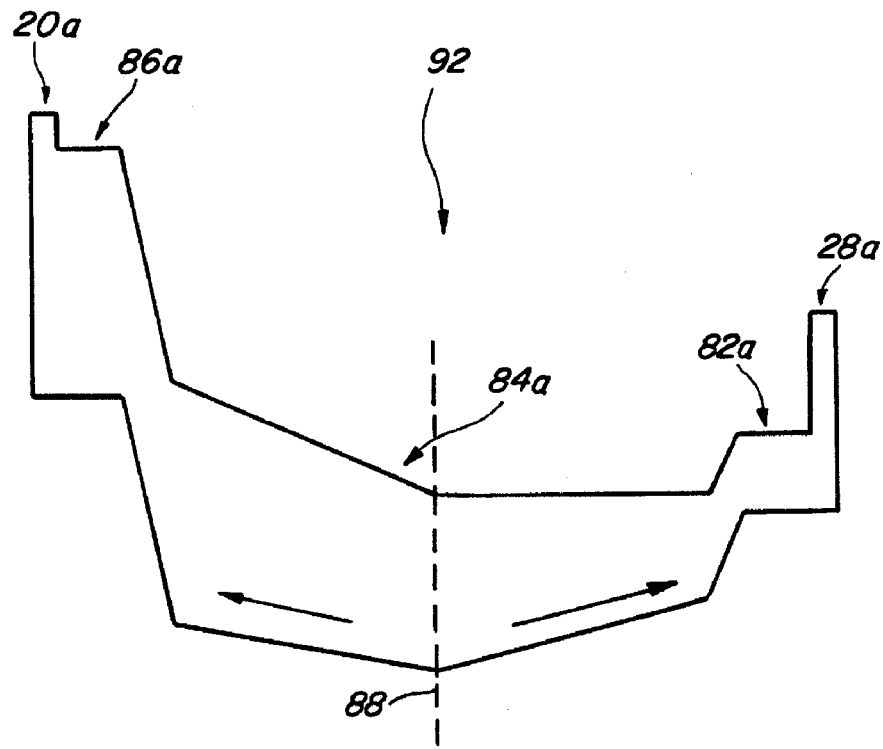
FIG. 8 illustrates the band gap profile across the multi-color pixel architecture of FIG. 6, with a first bias applied to the backside surface.
Figure 9:
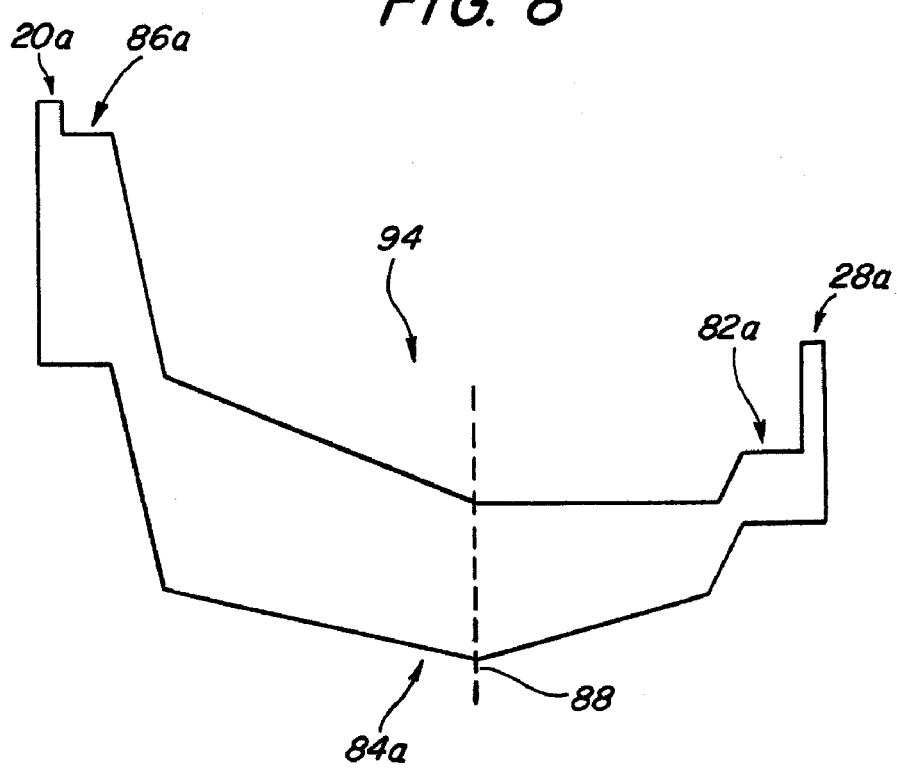
FIG. 9 illustrates the band gap profile across the multi-color pixel architecture of FIG. 6, with a second bias applied to the backside surface.

Dashed line 88 represents the edge of the depletion region from the third region 86 to the second region 84. Depending on the degree of reverse bias applied at the backside surface 48, the depletion region would increase and the dashed line 88 would move upwards. FIG. 7 illustrates the band gap profile 90 across the multi-color pixel architecture 80 of FIG. 6, without any bias applied to the backside surface 48. FIGS. 8 and 9 illustrate the band gap profiles 92 and 94 across the multi-color pixel architecture 80 of FIG. 6, with bias applied to the backside surface 48. The bias applied in FIG. 9 is higher than the one applied in FIG. 8. FIG. 7 shows an exemplary graded composition for the second region 84.

When a bias is applied to the backside surface 48, the edge of the depletion region, represented by the dashed line 88, may move away from the third region 86 and towards the first region 82. As exemplified in FIGS. 8 and 9, biasing the backside surface 48 moves the dashed line 88 over to the right towards the band gap profile for the first region 82. Anything to the left of the dashed line 88 gets collected by the third region 86 and anything to the right of the dashed line 88 gets collected by the first region 82. By moving the dashed line 88 over to the right, a larger fraction of the spectrum gets absorbed in the third region 86 and a smaller fraction in the first region 82. Hence, diffusion of minority carriers across the third region 86 grows as a function of bias applied to the backside surface 48.

Figure 10:
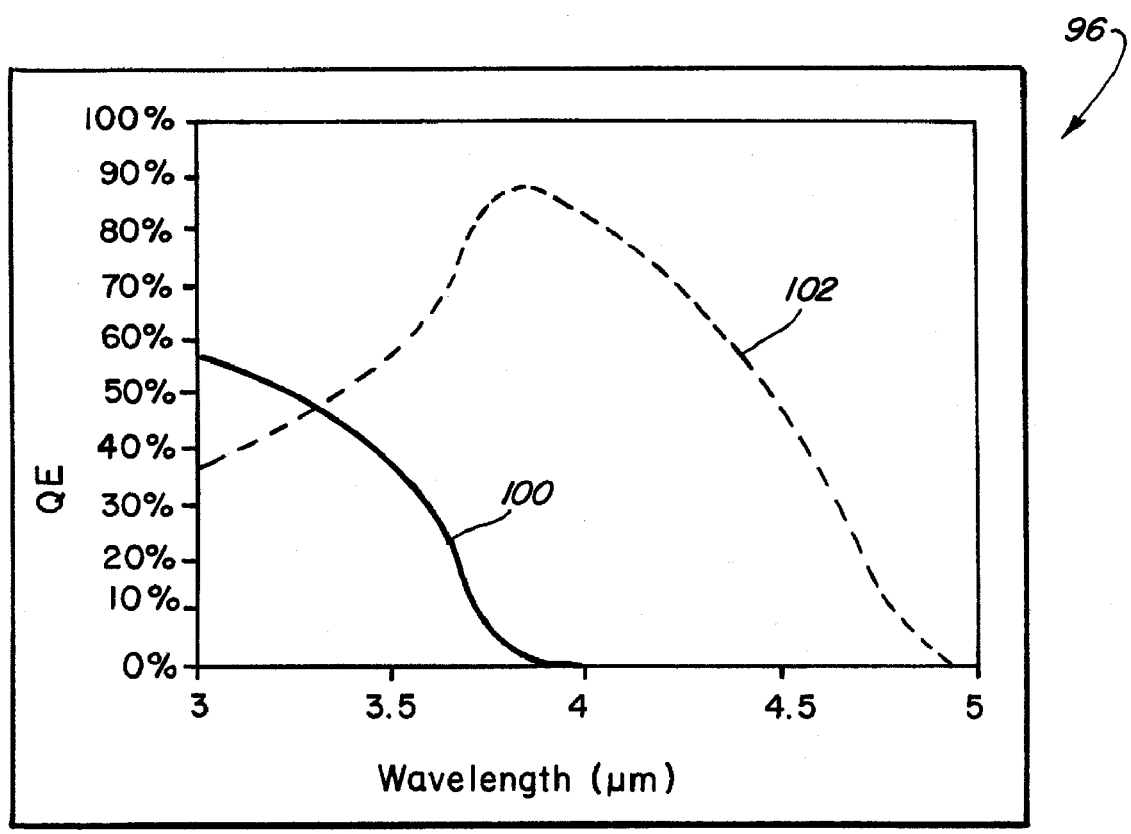
FIG. 10 is an exemplary graph of the signals collected for band gap profile of FIG. 8.
Figure 11:
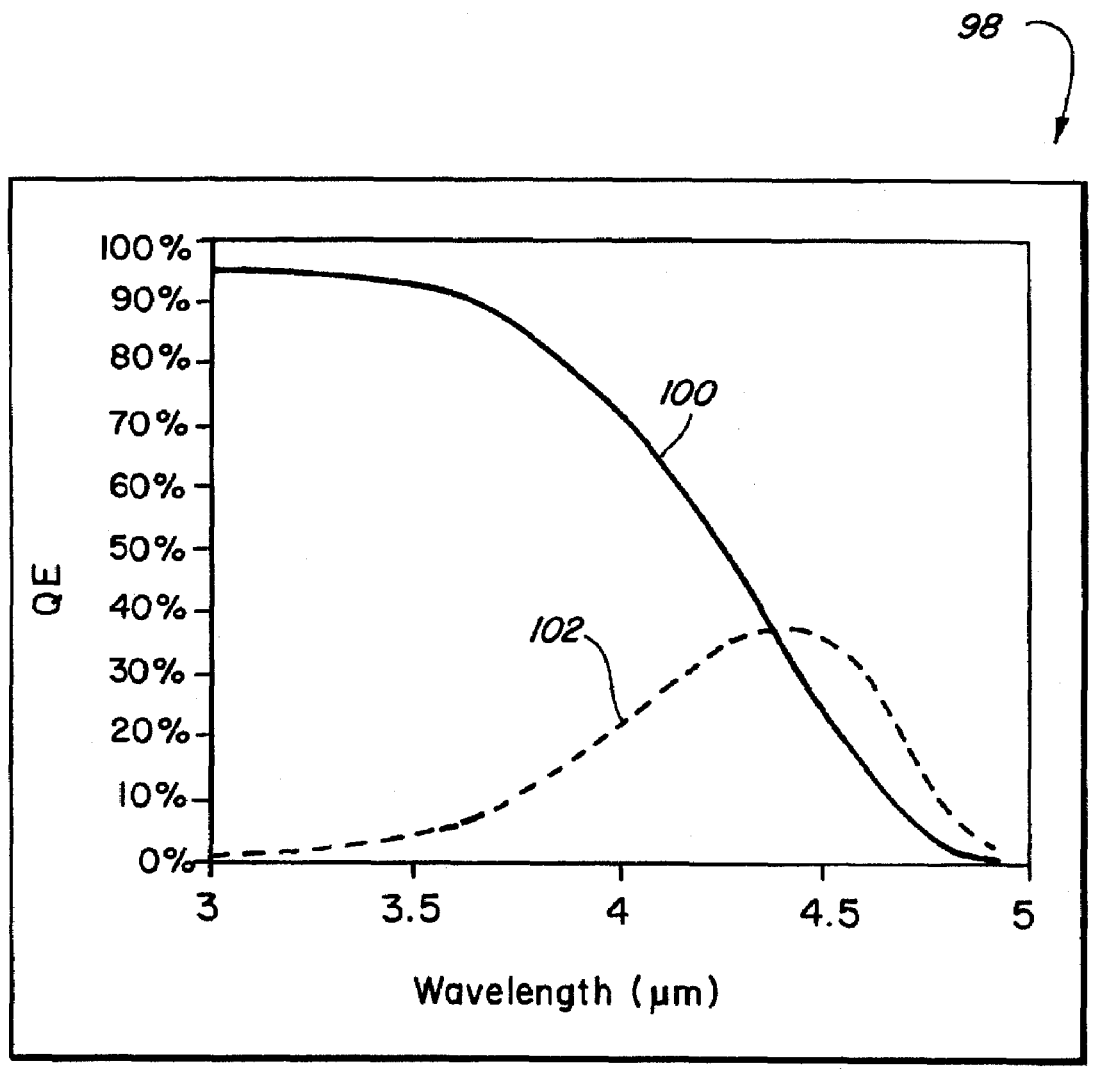
FIG. 11 is an exemplary graph of the signals collected for band gap profile of FIG. 9.

FIG. 10 is an exemplary graph 96 of the signals collected at first region 82 and third region 86 with band gap profile 92 of FIG. 8. FIG. 11 is an exemplary graph 98 of the signals collected at first region 82 and third region 86 with band gap profile 94 of FIG. 9. Both graphs 96 and 98 illustrate the signals collected in terms of percentage energy (QE) as a function of wavelength (μm). Graphs 96 and 98 show a curve 100 for the signal collected from the third region 86 and a curve 102 for the signal collected from the first region 82. Graph 98 shows an increase in signal collected from the third region 86, attributed to an increase in biasing applied to the backside surface 48. Curve 100 in graph 98 also spans over a greater wavelength spectrum and has a greater absorption of minority carriers. Graph 98 also shows a decrease in signal collected from the first region 82 due to the increased biasing. Thus, illustrating that diffusion of minority carriers across the third region 86 grows as a function of bias applied to the backside surface 48.

While the apparatus and method have been described in terms of what are presently considered to be the most practical and preferred embodiments, it is to be understood that the disclosure need not be limited to the disclosed embodiments. For example, the p-regions and n-commons may be reversed to have n-regions and p-commons. It is intended to cover various modifications and similar arrangements included within the spirit and scope of the claims, the scope of which should be accorded the broadest interpretation so as to encompass all such modifications and similar structures. The present disclosure includes any and all embodiments of the following claims.

The invention claimed is:

1. A multi-color photo detector comprising:
a first photodiode having a first p-type layer and a first n-type layer, the first photodiode generates charge when illuminated with light photons of a first wavelength range;
a second photodiode having a second p-type layer and a second n-type layer, the second photodiode generates charge when illuminated with light photons of a second wavelength range;
a barrier layer separating the first photodiode from the second photodiode to prevent spectral cross-talk; and
a readout integrated circuit electrically coupled to the first p-type layer of the first photodiode via a first metal interconnect and electrically coupled to the second p-type layer of the second photodiode via a second metal interconnect, the second metal interconnect traverses through the first photodiode and the barrier layer to contact the second p-type layer of the second photodiode, the second metal interconnect is separated from the first photodiode and the barrier layer by a first passivating insulator, and wherein the second metal interconnect traverses through the second n-type layer and the second p-type layer of the second photodiode, the first passivating insulator separates the second metal interconnect from the second n-type layer and the second p-type layer of the second photodiode, the second metal interconnect extends beyond the second p-type layer and contacts an exposed surface of the second p-type layer.

2. The multi-color photo detector of claim 1, wherein the first p-type layer and the second p-type layer are reticulated along their respective edges.

3. The multi-color photo detector of claim 1, wherein the first passivating insulator covers an exposed surface of the first p-type layer.

4. The multi-color photo detector of claim 1 further comprising a second passivating insulator for covering an exposed surface of the second p-type layer.

5. The multi-color photo detector of claim 1, wherein the second metal interconnect traverses through the second n-type layer of the second photodiode, the first passivating insulator separating the second metal interconnect from the second n-type layer of the second photodiode.

6. The multi-color photo detector of claim 1 further comprising a third metal interconnect that electrically couples the second metal interconnect to the second p-layer.

7. The multi-color photo detector of claim 1 further comprising:
- a third photodiode having a third n-type layer, the third photodiode generates charge when illuminated with light photons of a third wavelength range;
- a graded composition barrier separating the second n-type layer of the second photodiode from the third n-type layer of the third photodiode; and
- a voltage bias applied to the third photodiode to control the flow of charge generated from the second and third photodiodes.

8. A multi-color photo sensor comprising:
- a first photodiode having a first p-type layer and a first n-type layer, the first photodiode generates charge when illuminated with photons of a first wavelength range;
- a second photodiode having a second p-type layer and a second n-type layer, the second photodiode generates charge when illuminated with photons of a second wavelength range; and
- a readout integrated circuit electrically coupled to the first n-type layer of the first photodiode via a first metal interconnect and electrically coupled to the second n-type layer of the second photodiode via a second metal interconnect, the second metal interconnect traverses through the first photodiode to contact the second n-type layer of the second photodiode, the second metal interconnect is separated from the first photodiode by a first passivating insulator, and wherein the second metal interconnect traverses through the second p-type layer and the second n-type layer of the second photodiode, the first passivating insulator separates the second metal interconnect from the second p-type layer and the second n-type layer of the second photodiode, the second metal interconnect extends beyond the second n-type layer and contacts an exposed surface of the second n-type layer.

9. The multi-color photo sensor of claim 8 further comprising a barrier layer separating the first photodiode from the second photodiode to prevent spectral cross-talk, the barrier layer is selected from a group consisting of a semiconductor, an insulator and an air gap.

10. The multi-color photo sensor of claim 8, wherein the first p-type layer and the second p-type layer are reticulated along their respective edges.

11. The multi-color photo sensor of claim 8, wherein the first passivating insulator covers an exposed surface of the first p-type layer.

12. The multi-color photo sensor of claim 8 further comprising a second passivating insulator for covering an exposed surface of the second p-type layer.

13. The multi-color photo sensor of claim 8, wherein the second metal interconnect traverses through the second p-type layer of the second photodiode, the first passivating insulator separating the second metal interconnect from the second p-type layer of the second photodiode.

14. The multi-color photo sensor of claim 8 further comprising a third metal interconnect that electrically couples the second metal interconnect to the second p-layer.

15. The multi-color photo sensor of claim 8 further comprising:
- a third photodiode having a third n-type layer, the third photodiode generates charge when illuminated with photons of a third wavelength range;
- a graded composition barrier separating the second n-type layer of the second photodiode from the third n-type layer of the third photodiode; and
- a voltage bias applied to the third photodiode to control the flow of charge generated from the second and third photodiodes.

* * * * *